United States Patent [19]
Currie

[11] 4,310,811
[45] Jan. 12, 1982

[54] REWORKABLE MULTI-LAYER PRINTED CIRCUIT BOARD

[75] Inventor: Thomas P. Currie, St. Paul, Minn.

[73] Assignee: Sperry Corporation, New York, N.Y.

[21] Appl. No.: 130,679

[22] Filed: Mar. 17, 1980

[51] Int. Cl.³ .............................................. H01P 3/08
[52] U.S. Cl. ..................................... 333/1; 174/68.5; 333/33; 333/238; 361/421
[58] Field of Search .................... 333/1, 33, 236, 238; 361/414, 421

[56] References Cited

U.S. PATENT DOCUMENTS

| | | | |
|---|---|---|---|
| 3,530,411 | 9/1970 | Sear | 333/238 X |
| 3,605,063 | 9/1971 | Stewart | 361/414 X |
| 4,047,132 | 9/1977 | Krajewski | 333/238 |
| 4,130,723 | 12/1978 | Wakeling | 333/238 X |
| 4,202,007 | 5/1980 | Dougherty et al. | 361/414 X |

Primary Examiner—Paul L. Gensler
Attorney, Agent, or Firm—Douglas L. Tschida; Kenneth T. Grace; William E. Cleaver

[57] ABSTRACT

A rework layer for a multi-layer printed circuit board comprised of a reference layer and a wire network containing a plurality of conductors tailored to match the impedance characteristics existing between the internal layers of the printed circuit board, wherein the conductors can be selectively terminated after fabrication of the printed circuit board.

4 Claims, 5 Drawing Figures

4,310,811

REWORKABLE MULTI-LAYER PRINTED CIRCUIT BOARD

BACKGROUND OF THE INVENTION

The present invention relates to printed circuit boards and more specifically to a multi-layer printed circuit board that contains an additional rework layer that simplifies the rework process thereof and increases the density of possible rework.

As the amount and complexity of integrated circuitry on a printed circuit board increases, so does the complexity of the signal layers and the number of layers required for the multi-layer printed circuit boards. The increased complexity, however, limits the amount of rework that can be accomplished using present rework techniques.

Also, as the density and complexity of integrated circuits increase, propagation time and the associated length and impedance of the signal paths becomes more critical. It is therefore necessary that rework wiring match and accomodate the differences in the impedance in a multi-layer board.

Presently, when problems arise that require re-wiring of a multi-layer printed circuit board, twisted pair wire is employed, with one conductor being grounded and the other used to make the repair; but the use of such wire requires heavier wire and twice the number of wire terminations, and the availability of a large number of ground terminations over that which is required by using the present invention. Thus, the density of possible rework is limited.

Examples can be found in the prior art demonstrating the use of separate wires either embedded in the circuit board or sewn through vias therein to make connections to components mounted thereon, reference U.S. Pat. Nos. 3,711,626 and 3,701,838. Examples can also be found of wire scribed circuit boards that serve as alternatives to multi-layer printed circuit boards, reference U.S. Pat. No. 3,674,602 and the Multiwire ® reference guide (No. 05785000KC) of the Multiwire Division, Kollmorgen Corporation. Yet another example teaches the use of conductive patterns to equalize the impedances of signal layers spaced unequal distances from a conductive ground plane, reference U.S. Pat. No. 4,047,132.

The present invention borrows from this increasingly more complex technology and teaches an improved multi-layer printed circuit board that incorporates a dedicated rework layer which is generally comprised of a rework reference layer (i.e., at ground or some other potential) and a network of overlying wires semi-permanently affixed to the rework reference layer. The new combination thus enables the rework of the printed circuit board at any time and increases the density of possible rework by at least a factor of "two" over the previous cumbersome rework methods.

SUMMARY OF THE INVENTION

A multi-layer printed circuit board is disclosed which has a dedicated rework layer which is generally comprised of a rework reference layer that is separately affixed to the printed circuit board and an overlying network of wires that are semi-permanently affixed to the rework reference layer for facilitating the re-connection of components mounted on the printed circuit board, making new connections or overcoming defects in the buried signal layers. The network of rework wiring being selected to closely approximate the impedance characteristics of the buried signal layers.

DESCRIPTION OF THE PREFERRED EMBODIMENT

Figure 1:
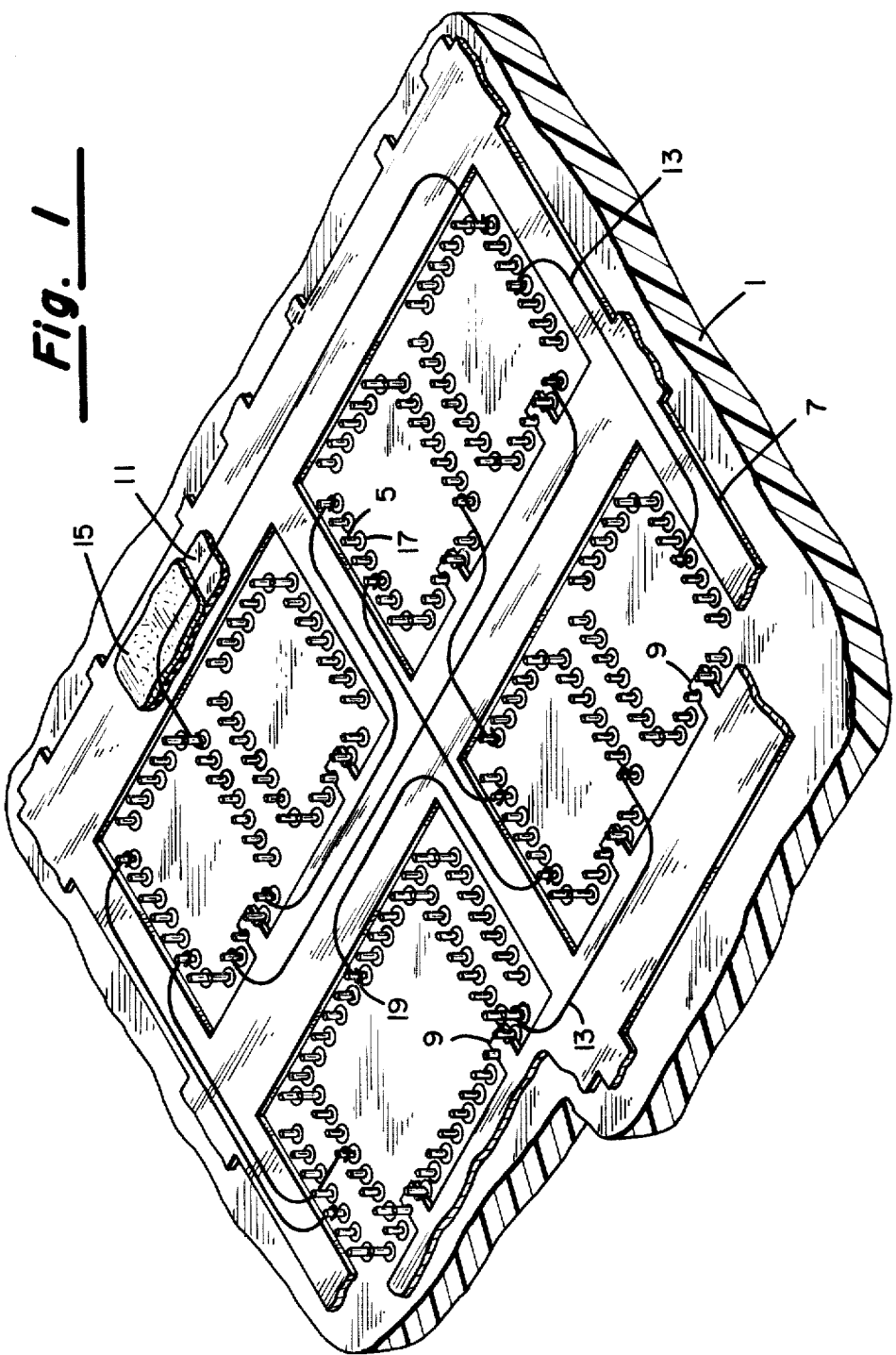
FIG. 1 shows a partial isometric view of a multi-layer printed circuit board containing a separately affixed rework layer.

Referring to FIG. 1, the present invention is shown in a partial view of a multi-layer printed circuit board 1 having affixed to one side thereof a number of integrated circuit packages (not shown) whose component leads 5 extend through the plated through holes or vias 17 of the printed circuit board 1. The printed circuit board 1 is typically comprised of a number of individual signal layers with one or more internal ground or reference layers (not shown), which layers are insulated from one another and fabricated in accordance with well known printed circuit board techniques. While the pattern of each of the internal signal and reference layers and stacking order is dependent upon the peculiar electrical circuit design for the printed circuit board 1, the general design of the printed circuit board 1 and arrangement of the integrated circuit packages, in the preferred embodiment, is directed to the uniform placement and spacing between the integrated circuit packages so as to provide a matrix grid arrangement over which the rework layer (generally comprising rework reference layer 7 and rework wires 13) is subsequently mounted.

Typically, the rework reference layer 7 is affixed with an adhesive to the printed circuit board 1 subsequent to fabrication of the printed circuit board 1; but depending on the embodiment, the adhesive may not be required. The adhesive therefore is not shown for purposes of clarity but will be described in more detail hereinafter. The rework reference layer 7 is then connected to the internal reference layers at each of the individual tabs 9, since each via or plated through hole 17 at the tabs 9 are electrically connected to the internal reference layers. Thus the rework reference layer 7 typically is at a common reference with respect to the internal reference layers of the printed circuit board 1, but could be at a different reference potential if necessary, depending upon the application.

Subsequent to the affixation of the rework reference layer 7, a dielectric insulator 11 conforming to the pattern of the rework reference layer 7 is placed over the rework reference layer 7 to provide a suitable dielectric spacing between the individual rework wires 13 and the rework reference layer 7. An adhesive 15 is then applied over the insulator 11, which adhesive can be of several types but which in general serves to cause each of the rework wires 13 to adhere to the insulator and the insulator to the rework reference layer 7. The rework wires 13 are then applied to the adhesive in a predetermined network and which network is selected to optimize the reworkability of the printed circuit board 1 for the typical problems encountered in final checkout and for other unanticipated problems. It is also desirable if the adhesive 15 is of a type that enables the adding of additional rework wires 13 to the network in the field (i.e. customer site), if necessary. Desirable adhesives, therefore, are of the thermoplastic type wherein the adhesive is relatively stable until activated by heat, such as ultrasonic energy, ultraviolet radiation, hot air, a metal stylus heated by a resistance element or some other suitable heat source. A solvent-activated adhesive can also be used.

The rework wire 13 used in the rework wiring network is, typically, a 34AWG magnet wire, which when combined with a rework reference layer 7 of approximately 0.01 inches thick and an insulator 11 of a thickness of 0.0015 inches, produces a characteristic impedance of 50 ohms. While 50 ohms is the typical characteristic impedance between a signal carrying layer and the internal reference layer of the multi-layer printed circuit board 1, it is to be recognized that the characteristic impedance of the signal layers may vary depending on the number of signal carrying layers in the multi-layer printed circuit board 1 and the spacing between the internal reference layer and the individual signal carrying layers in which the defects might occur and thus necessitate the rework wiring. Such cases of non-uniform impedance characteristics can be accommodated under the present invention by applying additional wires 13 of varying gauges and/or insulation thickness to the wiring network, the specific wire used being dependent on the spacing between the affected wiring layers.

Figure 2:
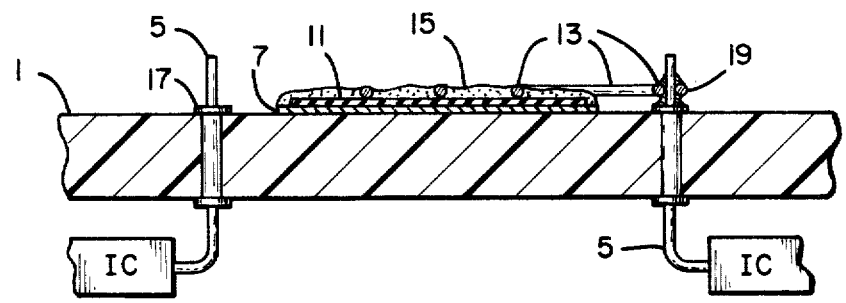
FIG. 2 shows a generalized cross section of a printed circuit board having the rework reference layer fabricated as part of the surface of the printed circuit board.
Figure 3:
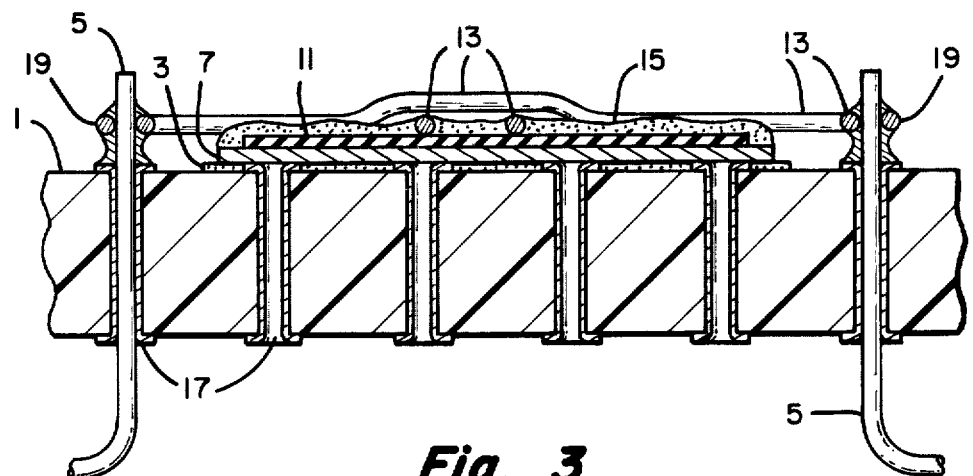
FIG. 3 shows a detailed cross section of a printed circuit board having the rework reference layer and wiring affixed after assembly of the printed circuit board and in which the relationship of the vias or plated through holes are contrasted to the rework wiring.

Referring to FIGS. 2 and 3, detailed cross sections of the above-described invention are shown. FIG. 2 is a general depiction of the rework reference layer 7 as it would appear if it were fabricated as part of the surface of the multi-layer printed circuit board 1. The dielectric insulator 11 and the thermoplastic adhesive 15 are overlayed on the rework reference layer 7 with the network wires 13 embedded in the adhesive layer and in contact with the dielectric insulator 11. Also shown is a typical rework connection 19, which merely requires the wrapping and soldering of a rework wire 13 to a selected component lead 5. It is to be noted that during the typical rework operation it is not necessary to strip the insulator from the rework wire 13, since the insulation melts off during the soldering step.

FIG. 3 is another depiction similar to FIG. 2, but wherein a plurality of the vias or plated through holes 17 are positioned beneath the rework reference layer 7. The vias 17 are used to interconnect the individual layers of the multi-layer printed circuit board 1 and the components mounted on the surface of the printed circuit board 1. In this situation, however, it is necessary that the adhesive 3 which bonds the rework reference layer 7 to the printed circuit board 1 be of an insulating type or else an additional insulator should be placed between the rework grid and the individual vias to prevent shorting in the manner of FIG. 5.

Figure 4:
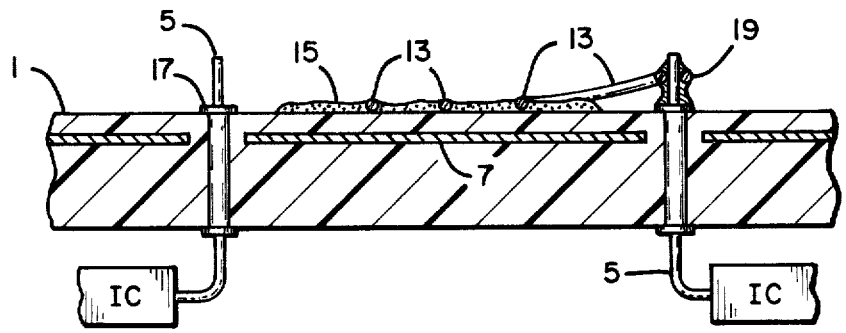
FIG. 4 shows a cross section of an alternative configuration, wherein the rework reference layer is fabricated as part of the printed circuit board and the rework wiring is subsequently affixed to the printed circuit board.

Referring to FIG. 4, yet another cross section of a multi-layer printed circuit board 1 containing the present invention is shown, wherein the rework reference layer 7 is included as an additional layer of the multi-layer printed circuit board 1 during its fabrication. Such an arrangement necessarily requires only the routing of the individual rework wires 13 after the fabrication of the printed circuit board 1 and their affixation to the printed circuit board 1 via the thermoplastic adhesive 15. Because of the complexity and high density of a typical multi-layer printed circuit board 1, however, this embodiment suffers in that it is difficult to accommodate the vias 17 depicted in FIG. 3.

Figure 5:
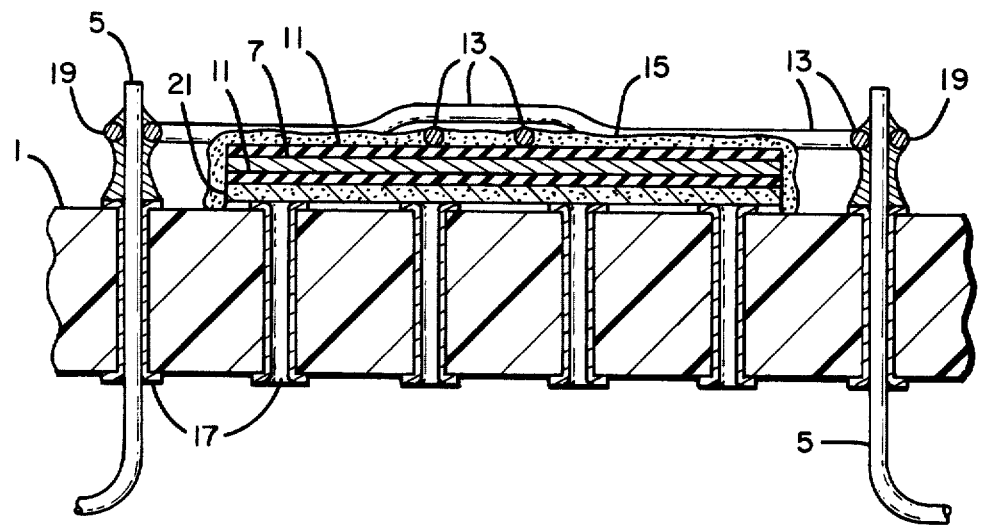
FIG. 5 shows a cross section of the preferred embodiment, wherein the rework reference layer is encapsulated between two insulators and affixed to the printed circuit board with a transfer film adhesive.

FIG. 5 depicts yet another cross section of the preferred embodiment of the present invention and which embodiment finds application in the "mother-daughter" board combinations found in "mainframe" computers. The rework layer in these applications being substantially the same as referenced for FIGS. 2 and 3. It is to be noted though that a transfer film adhesive 21 is now used to affix the rework reference layer 7, since it is now encapsulated between the epoxy glass insulators 11. The thickness of the insulators 11 are again selected based on the characteristic impedance desired between the rework wires 13 and the rework reference layer 7, typically 50 ohms. It is to be noted too, that the rework reference layer 7 in the preferred embodiment also serves to improve the grounding characteristics of the internal reference layers of the multi-layers printed circuit board 1. It is to be further noted that in some embodiments the rework reference layer 7 could be used to replace one or possibly more of the internal reference layers, thus enabling a savings in the number of layers in printed circuit board 1 and still accomodating the increased density and rework demands for the multi-layer printed circuit board 1.

While the present invention has been described with reference to a number of different embodiments, it is to be recognized that yet other embodiments are conceivable to one of skill and the art which do not depart from the scope and spirit of the claimed invention. It is therefore intended that the invention described above be interpreted as illustrative and not in a limiting sense.

What is claimed is:

1. A multi-layer printed circuit assembly having a plurality of conductive planar layers, at least one of which is a reference layer, and a rework layer, said rework layer comprising:

a plurality of wires overlying said assembly;

means for insulating each of said wires from each other and said assembly;

means for semi-permanently affixing said wires and insulating means to said assembly; and each of said wires having a characteristic impedance with respect to said reference layer selectively establishd to approximate the characteristic impedance of one of said assembly's conductive planar layers with respect to said reference layer, whereby said wires can be selectively detached and used to make electrical jumper connections to said conductive planar layers of equivalent characteristic impedance.

2. A printed circuit assembly having two or more conductive planar layers, at least one of which is a biased reference layer, and including a rework layer comprising:

a plurality of wires overlying and insulated from said assembly, each other and said reference layer;

means for semi-permanently affixing said wires to said assembly; and each of said wires having a characteristic impedance with respect to said reference layer selectively established to approximate the characteristic impedance of one of said assembly's conductive planar layers with respect to said reference layers, whereby said wires can be selectively detached and used to make electrical jumper connections to said conductive planar layers of equivalent characteristic impedance.

3. A printed circuit assembly having one or more conductive planar layers, one or more internal reference layers and including a rework layer affixed to said assembly, wherein said rework layer comprises:

a rework reference layer;

a plurality of wires of different sizes overlying said rework reference layer;

means for electrically insulating each of said wires from said rework reference layer and each other;

means for semi-permanently affixing said wires to said rework reference layer;

means for biasing said rework reference layer to a reference potential; and the characteristic impedance of each of said wires with respect to said rework reference layer selectively established to approximate the characteristic impedance of one of said assembly's conductive planar layers with respect to one of said internal reference layers, whereby said wires can be selectively detached and used to make electrical jumper connections to said assembly's conductive planar layers of equivalent characteristic impedance.

4. A printed circuit assembly as set forth in either claim 2 or 3 wherein said semi-permanent affixing means is a heat-activated thermoplastic adhesive.

* * * * *